(12) United States Patent  
Onitsuka et al.

(10) Patent No.: US 9,485,867 B2  
(45) Date of Patent: Nov. 1, 2016

(54) WIRING BOARD

(75) Inventors: Yurie Onitsuka, Satsumasendai (JP); Yousuke Moriyama, Satsumasendai (JP)

(73) Assignee: KYOCERA CORPORATION, Kyoto (JP)

( * ) Notice: Subject to any disclaimer, the term of this patent is extended or adjusted under 35 U.S.C. 154(b) by 201 days.

(21) Appl. No.: 13/880,589

(22) PCT Filed: Oct. 27, 2011

(86) PCT No.: PCT/JP2011/074862  
§ 371 (c)(1),  
(2), (4) Date: Apr. 19, 2013

(87) PCT Pub. No.: WO2012/057286  
PCT Pub. Date: May 3, 2012

(65) Prior Publication Data  
US 2014/0000940 A1    Jan. 2, 2014

(30) Foreign Application Priority Data

Oct. 27, 2010    (JP) .................................. 2010-240988

(51) Int. Cl.  
*H05K 1/09* (2006.01)  
*H05K 1/18* (2006.01)  
(Continued)

(52) U.S. Cl.  
CPC ................. *H05K 1/18* (2013.01); *H01L 23/13* (2013.01); *H01L 23/49805* (2013.01);  
(Continued)

(58) Field of Classification Search  
CPC . H01L 23/13; H01L 23/49805; H01L 23/36; H01L 33/486; H01L 2924/09701; H01L 2924/0002; H01L 2924/00; H05K 1/02; H05K 1/18; H05K 3/0052; H05K 3/0061; H05K 2201/0769; H05K 2201/09145; H05K 2201/0919; H05K 2201/09845  
USPC ....... 174/250, 251, 255, 260, 252, 520, 548; 361/760, 767, 806  
See application file for complete search history.

(56) References Cited

U.S. PATENT DOCUMENTS 4,458,291 A    7/1984  Yanagisawa et al.  
4,630,172 A *  12/1986  Stenerson et al. ............ 361/718  
(Continued)

FOREIGN PATENT DOCUMENTS

EP    22 37 316 A1    10/2010  
JP    S58-016552 A    1/1983  
(Continued)

OTHER PUBLICATIONS

Office Action dated Mar. 25, 2014 issued in Japanese Patent Application No. 2012-540943.  
(Continued)

*Primary Examiner* — Hoa C Nguyen  
(74) *Attorney, Agent, or Firm* — Procopio Cory Hargreaves and Savitch LLP

(57) ABSTRACT

A wiring board includes an insulating substrate having a side surface including a protrusion portion or a recess portion and a lower surface having a metal member bonded thereto; a wiring conductor embedded in the insulating substrate and having an exposed portion partially exposed above the protrusion portion or the recess portion from the side surface of the insulating substrate; and a metal member bonded to the lower surface of the insulating substrate. It is possible to suppress occurrence of ion migration between the wiring conductor and the metal member by increasing a distance between the exposed portion and the metal member without increasing a thickness of the wiring board.

6 Claims, 13 Drawing Sheets

(51) Int. Cl.
   *H01L 23/13* (2006.01)
   *H01L 23/498* (2006.01)
   *H05K 1/02* (2006.01)
   *H01L 23/36* (2006.01)
   *H01L 33/48* (2010.01)
   *H05K 3/00* (2006.01)

(52) U.S. Cl.
   CPC ............... *H05K 1/02* (2013.01); *H01L 23/36* (2013.01); *H01L 33/486* (2013.01); *H01L 2924/0002* (2013.01); *H01L 2924/09701* (2013.01); *H05K 3/0052* (2013.01); *H05K 3/0061* (2013.01); *H05K 2201/0769* (2013.01); *H05K 2201/0919* (2013.01); *H05K 2201/09145* (2013.01); *H05K 2201/09845* (2013.01)

(56) References Cited

U.S. PATENT DOCUMENTS

| | | | | |
|---|---|---|---|---|
| 4,694,123 | A * | 9/1987 | Massey | 174/117 FF |
| 4,879,588 | A * | 11/1989 | Ohtsuka et al. | 257/664 |
| 5,136,471 | A * | 8/1992 | Inasaka | H01L 23/5385 174/255 |
| 5,219,292 | A * | 6/1993 | Dickirson et al. | 439/67 |
| 5,488,765 | A * | 2/1996 | Kubota | H01G 2/065 257/E21.525 |
| 5,498,405 | A * | 3/1996 | Gerwick et al. | 424/59 |
| 7,348,494 | B1 * | 3/2008 | Handforth et al. | 174/260 |
| 2004/0208210 | A1 | 10/2004 | Inoguchi | |
| 2006/0220205 | A1 | 10/2006 | Hongo | |
| 2007/0267736 | A1 * | 11/2007 | Shimanuki | 257/692 |
| 2008/0007143 | A1 * | 1/2008 | Nakamura et al. | 310/358 |
| 2008/0179711 | A1 | 7/2008 | Fujimoto et al. | |
| 2009/0296349 | A1 * | 12/2009 | Suzuki | 361/705 |
| 2009/0302344 | A1 | 12/2009 | Inoguchi | |
| 2011/0048796 | A1 * | 3/2011 | Tsujino | 174/549 |
| 2011/0309406 | A1 | 12/2011 | Inoguchi | |

FOREIGN PATENT DOCUMENTS

| | | |
|---|---|---|
| JP | 2004-311791 A | 11/2004 |
| JP | 2007-019394 A | 1/2007 |
| JP | 2008-130701 A | 6/2008 |
| JP | 2010-074118 A | 4/2010 |

OTHER PUBLICATIONS

International Search Report dated Nov. 22, 2011, issued for International Application No. PCT/JP2011/074862.

Extended European Search Report dated Jul. 13, 2016 issued by the European Patent Office for Counterpart European Application No. EP 11 83 6419.

* cited by examiner (a)

(b)

(a)

(b)

(a)

(b)

(a)

(b)

(a)

(b)

(a)

← DIRECTION C (b)

(a)

(b)

(a)

(b)

(a)

(b)

(a)

← DIRECTION C (b)

(a)

(b)

(a)

(b)

WIRING BOARD

TECHNICAL FIELD

The present invention relates to a wiring board for installation of a device such as a light-emitting device, a semiconductor device, or a crystal oscillation device, an electronic apparatus constructed by mounting a device on the wiring board, and a segmentable wiring board.

BACKGROUND ART

A conventionally-designed wiring board for installation of a device such as a light-emitting device or a semiconductor device is composed of, for example, an insulating substrate, a wiring conductor, and a metal member. For example, the wiring conductor is embedded in the insulating substrate so as to be partly exposed from a side surface of the insulating substrate. The metal member is bonded to the lower surface of the insulating substrate by a bonding member (refer to Patent Literature 1, for example).

For example, a part of the wiring conductor which is partially exposed from the side surface of the insulating substrate results from the cutting-off of a plating wiring embedded in the base board of a segmentable wiring board entailed by the splitting of the segmentable wiring board.

An electronic apparatus is constructed by mounting a device on such a wiring board and then electrically connecting the individual electrodes of the device to their respective wiring conductors via electrically connecting means such as solder or a bonding wire.

CITATION LIST

Patent Literature

Patent Literature 1: Japanese Unexamined Patent Publication JP-A 2004-311791

SUMMARY OF INVENTION

Technical Problem

In recent years, as wiring boards have come to be lower in profile, the spacing between a metal member bonded to the lower surface of a wiring board and a wiring conductor exposed from a side surface of the wiring board is decreased correspondingly, which has given rise to a concern that the wiring conductor and the metal member may be electrically connected to each other due to ion migration arising between the wiring conductor exposed from the side surface of the wiring board and the metal member. In the event of an electrical connection being established between the wiring conductor exposed from the side surface of the wiring board and the metal member, short-circuiting will be caused in a plurality of wiring conductors via the metal member.

The invention has been devised in view of the problems associated with the conventional art as mentioned above, and accordingly an object of the invention is to provide a wiring board capable of suppressing electrical connection between a wiring conductor exposed from a side surface of the wiring board and a metal member.

Solution to Problem

According to one aspect of the invention, a wiring board includes an insulating substrate and a wiring conductor embedded in the insulating substrate and partly exposed from a side surface of the insulating substrate, and the side surface of the insulating substrate has a protrusion portion or recess portion located between the wiring conductor exposed from the side surface of the insulating substrate and a lower surface of the insulating substrate.

According to another aspect of the invention, an electronic apparatus includes the wiring board constructed as described above and a device mounted on the wiring board.

According to still another aspect of the invention, a segmentable wiring board includes a base board having a plurality of wiring board regions and a wiring conductor embedded in the base board so as to straddle the plural wiring board regions, and the base board also has a void provided between the wiring conductor of the base board and the lower surface of the base board so as to straddle a boundary of the plurality of wiring board regions.

Advantageous Effects of Invention

According to the wiring board pursuant to the invention, since the side surface has the protrusion portion or recess portion located between the wiring conductor exposed from the side surface and the lower surface of the insulating substrate, it is possible to suppress electrical connection between a part of the wiring conductor which is exposed from the side surface of the insulating substrate and a metal member bonded to the lower surface of the insulating substrate due to ion migration without causing an increase in the thickness of the wiring board.

DESCRIPTION OF EMBODIMENTS

Hereinafter, several exemplificative embodiments of the invention will be described with reference to the accompanying drawings.

(First Embodiment)

Figure 1:
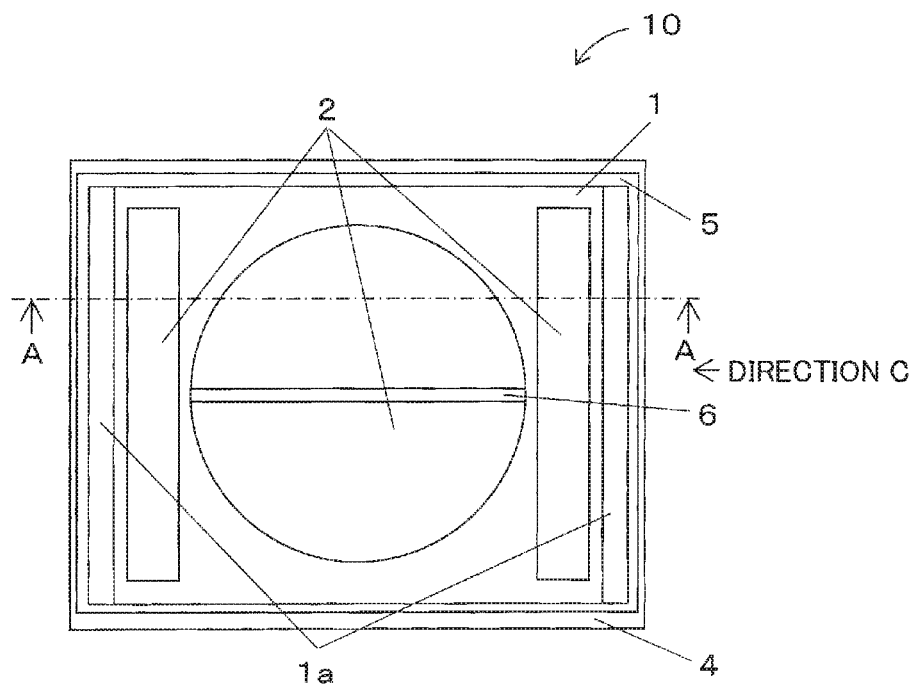
FIG. 1(a) is a plan view showing a wiring board in accordance with a first embodiment of the invention.
FIG. 1(b) is an example of a diagrammatic perspective view of part of the wiring board as viewed in a direction C indicated in FIG. 1(a)
Figure 1:
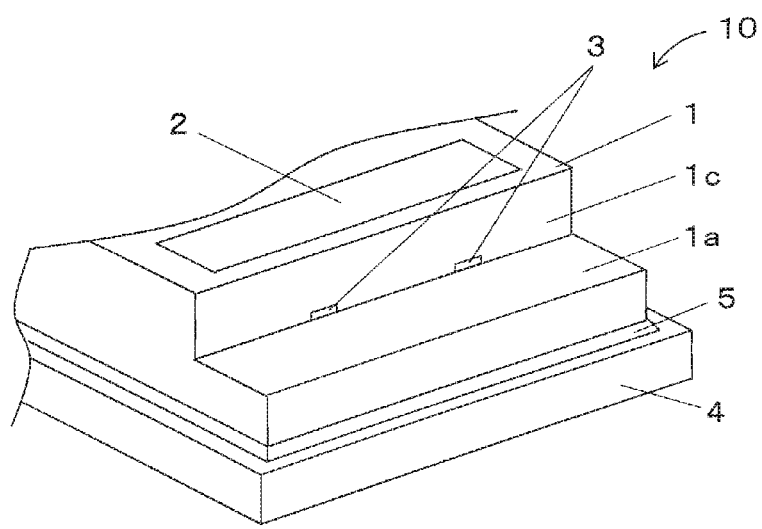
Figure 2:
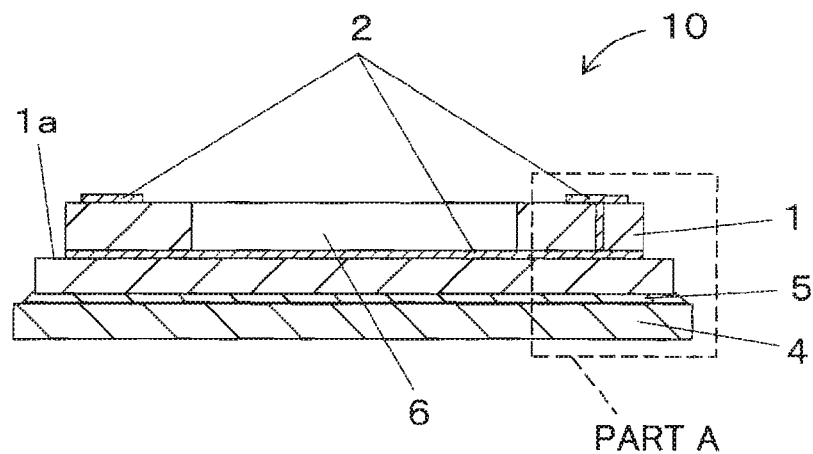
FIG. 2(a) is a sectional view taken along the line A-A shown in FIG. 1(a)
FIG. 2(b) is an enlarged sectional view of a part A shown in FIG. 2(a)
Figure 2:
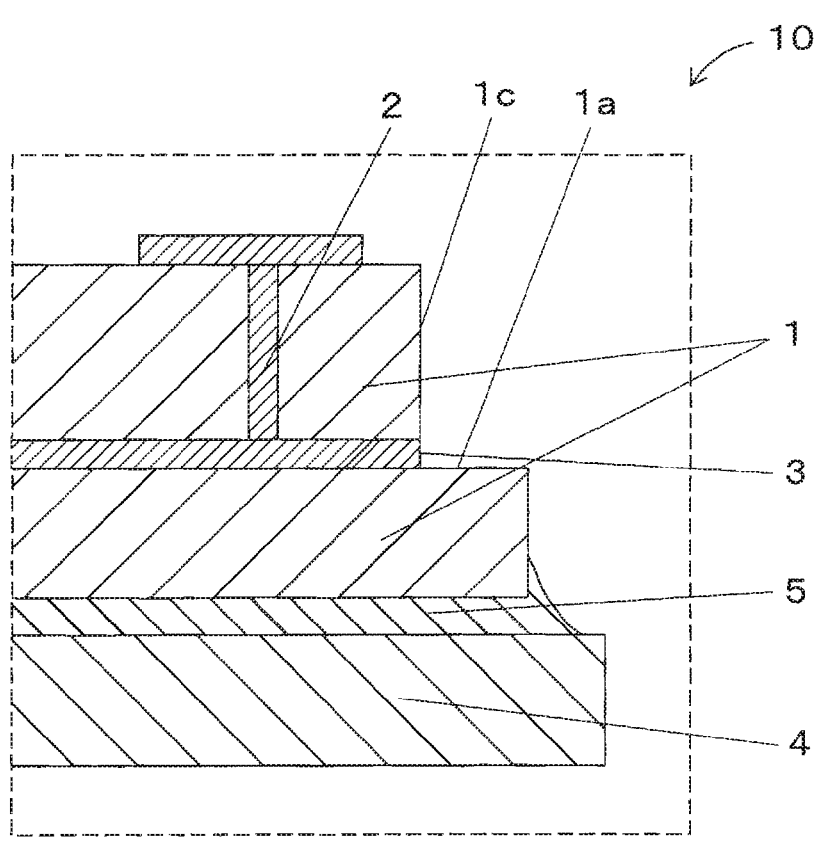

As shown in FIGS. 1 and 2, an electronic apparatus in accordance with a first embodiment of the invention includes a wiring board 10 and a device mounted on the wiring board 10.

The wiring board 10 includes an insulating substrate 1, a wiring conductor 2 embedded in the insulating substrate 1, and a metal member 4 bonded to the lower surface of the insulating substrate 1.

The insulating substrate 1 has a protrusion portion 1*a* provided in a side surface 1*c* thereof. The protrusion portion 1*a* is formed by jutting a lower part of the side surface 1*c* from the insulating substrate 1 so that the protrusion portion 1*a* protrudes beyond the side surface 1*c*. It is preferable that the jutting length of the protrusion portion 1*a* is greater than or equal to 1.0 mm. For example, as exemplified in FIG. 1, the protrusion portion 1*a* is provided so as to extend along the entire width of the lower part of the side surface 1*c* when seen in a plan view. As employed herein, the expression "seen in a plan view" refers to the viewing of the construction in a direction C as indicated in FIG. 1.

In a case where the side surface of the protrusion portion 1*a* is greater in surface roughness than the upper surface of the protrusion portion 1*a*, the side surface of the protrusion portion 1*a* is more susceptible to moisture adhesion than is the upper surface of the protrusion portion 1*a*, wherefore moisture tends to collect on the side surface of the protrusion portion 1*a* and is thus less likely to adhere to the entire area of the protrusion portion 1*a*. As exemplified in FIG. 3 by way of a modified form of the exemplification shown in FIGS. 1 and 2, the protrusion portion 1*a* may be provided in only part of the lower part of the side surface 1*c* in the direction of its width when viewed in the direction C. In a case where the lower surface of the insulating substrate 1 is flush with the lower surface of the protrusion portion 1*a*, in contrast to a case where the protrusion portion 1*a* is not provided, it is possible to increase the area of the lower surface of the insulating substrate 1.

For example, in the case of placing a cap-like lid body on the upper surface of the wiring board 10, the upper surface of the protrusion portion 1*a* can be utilized for the bonding of the lid body. For example, a lid body having a lens or the like can be firmly bonded around the insulating substrate 1 so as to hold the insulating substrate 1.

As exemplified in FIGS. 1 and 2, the insulating substrate 1 may include a cavity 6. For example, the cavity 6 is provided in the upper surface of the insulating substrate 1.

As the material for forming the insulating substrate 1, ceramics or resin can be used.

For the insulting substrate 1, in the case of using a ceramic material, for example, aluminum oxide sintered body (alumina ceramics), aluminum nitride sintered body, mullite sintered body or glass ceramic sintered body, can be used. On the other hand, for the insulating substrate 1, in the case of using a resin material, for example, epoxy resin, polyimide resin, acrylic resin, phenol resin, polyester resin or fluorine-series resin such as tetrafluoroethylene resin, can be used.

In a modified form of the exemplification shown in FIGS. 1 and 2, a concavity may be provided in the upper surface or the side surface of the protrusion portion 1*a*. The provision of the concavity makes it possible to shorten the jutting length of the protrusion portion la and thereby achieve downsizing of the wiring board 10. In the case of providing the protrusion portion 1*a* so as to extend over the entire lower part of the side surface 1*c* of the insulating substrate 1, it is advisable to design the concavity as a slot extending along the entire protrusion portion 1*a*. Moreover, the concavity can be utilized for the bonding or retention of a lid body or a tab of the lid body.

Otherwise, this modification example is structurally identical to the exemplification shown in FIGS. 1 and 2.

Figure 3:
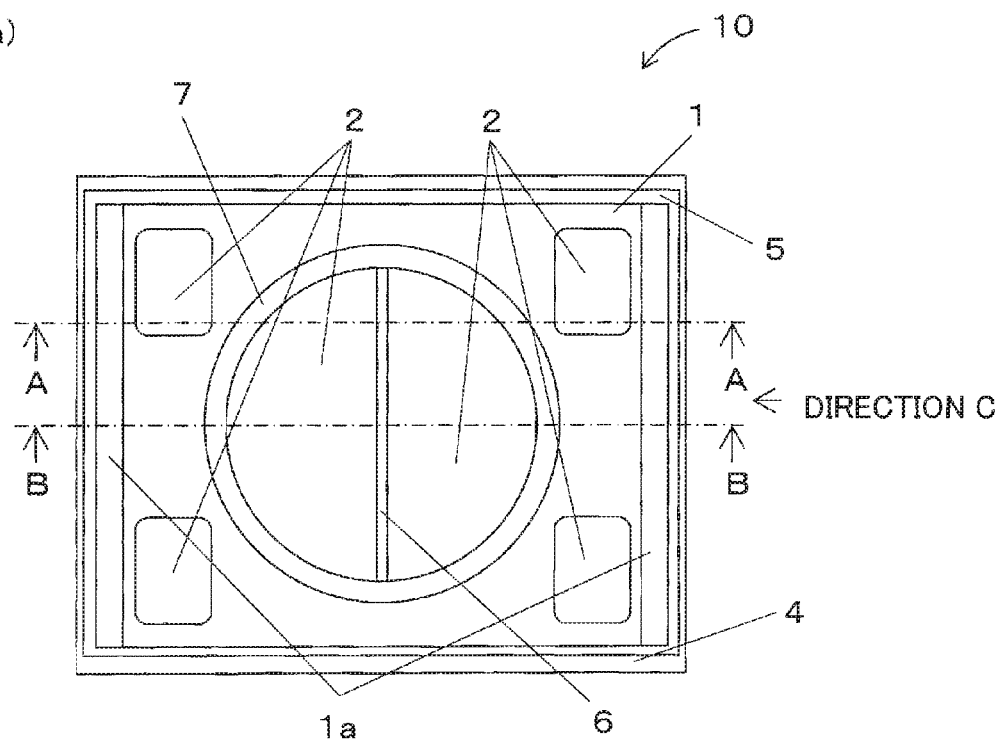
FIG. 3(a) is a plan view showing the wiring board in accordance with the first embodiment of the invention.
FIG. 3(b) is an example of a diagrammatic perspective view showing part of the wiring board as viewed in a direction C indicated in FIG. 3(a)
Figure 3:
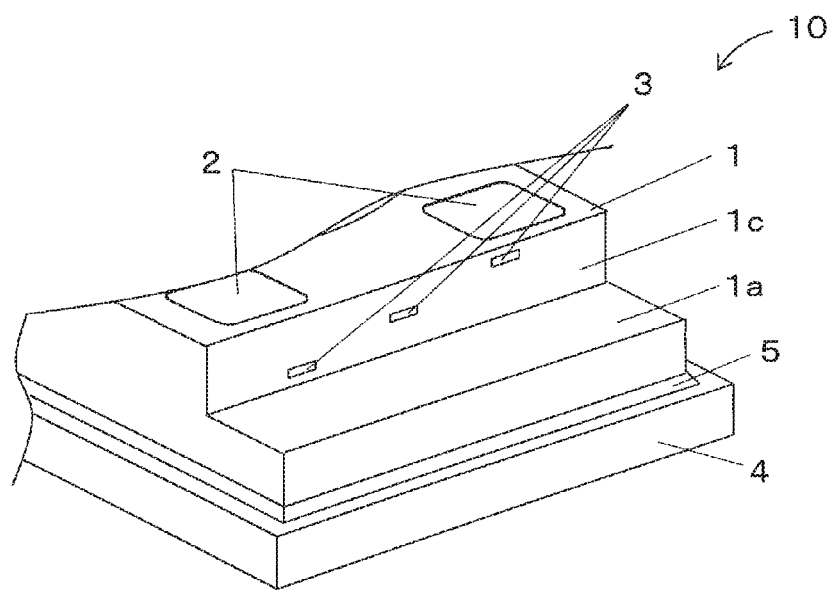
Figure 4:
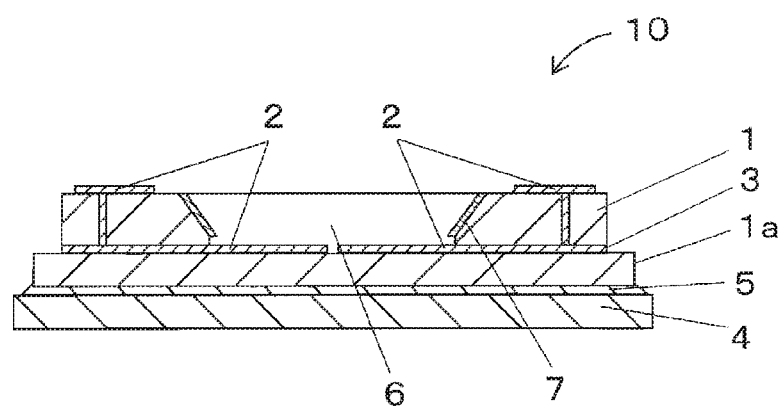
FIGS. 4(a) is a sectional view taken along the line A-A shown in FIG. 3(a)
FIG. 4(b) is a sectional view taken along the line B-B shown in FIG. 3(a)
Figure 4:
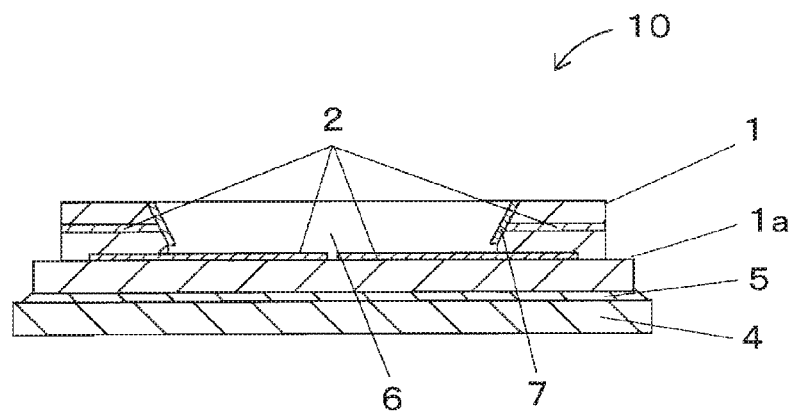

In a modified form of the exemplification shown in FIGS. 1 and 2, in a case where the cavity 6 is intended for the installation of a light-emitting device, as exemplified in FIGS. 3 and, it is preferable that an angle θ formed between the inner side surface of the cavity 6 and the bottom surface of the cavity 6 is an obtuse angle, in particular an obtuse angle of 110° to 145°. By adjusting the angle θ to fall in the above-described range, the inner side surface of the through hole constituting the cavity 6 can be created in an efficient manner with stability by means of punching, and thus a light-emitting apparatus which employs this wiring board 10 can be downsized readily. Moreover, light emitted from the light-emitting device is allowed to radiate outward satisfactorily.

The wiring conductor 2 is embedded in the insulating substrate 1 and is partly exposed above the protrusion portion 1*a* from the side surface 1*c* of the insulating substrate 1. A part of the wiring conductor 2 which is exposed from the side surface 1*c* of the insulating substrate 1 will be defined as an exposed portion 3.

Moreover, an end of the wiring conductor 2 is led out to the top side.

For example, the exposed portion 3 is utilized for the passage of an electric current used to deposit a plating layer on the surface of the part of the wiring conductor 2 leading onto the upper surface of the insulating substrate 1 by electrolytic plating technique. Moreover, for example, where a terminal electrode for making connection with an external circuit board is disposed on the side surface 1*c* of the insulating substrate 1, the exposed portion 3 may be electrically connected to the terminal electrode.

For example, in the exemplifications shown in FIGS. 1 to 6, the parts of the wiring conductor 2 leading onto the top side are arranged on the upper surface of the insulating substrate 1 so as to sandwich the cavity 6 between them. The wiring conductor 2 is electrically connected to the device mounted on the upper surface of the insulating substrate 1 and the wiring of an external circuit board as well.

Figure 6:
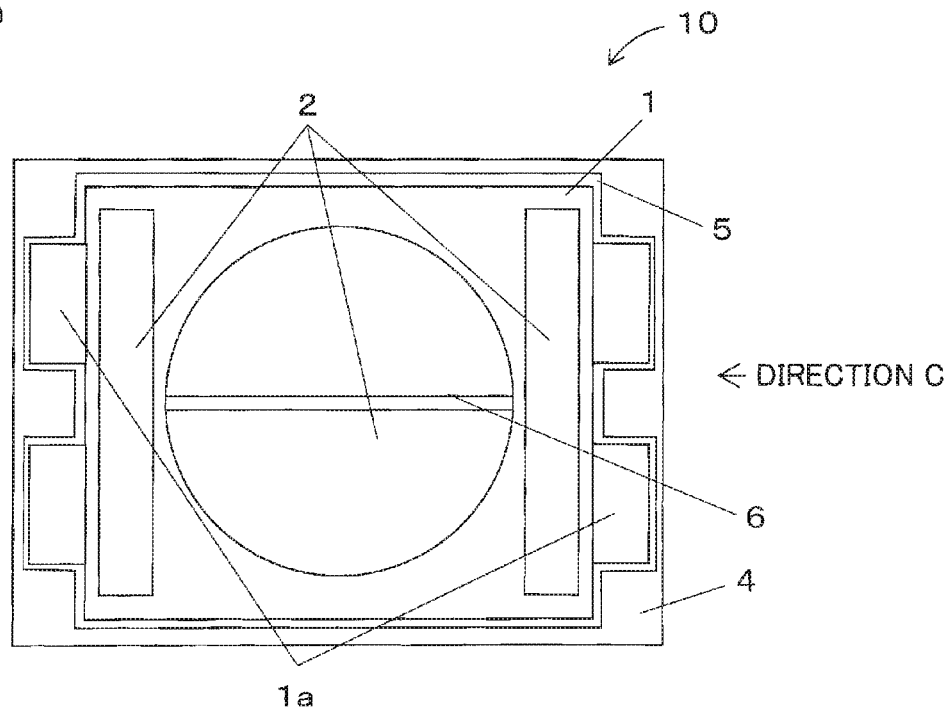
FIG. 6(a) is a plan view showing the wiring board in accordance with the first embodiment of the invention.
FIG. 6(b) is an example showing a diagrammatic perspective view of part of the wiring board as viewed in a direction C indicated in FIG. 6(a)
Figure 6:
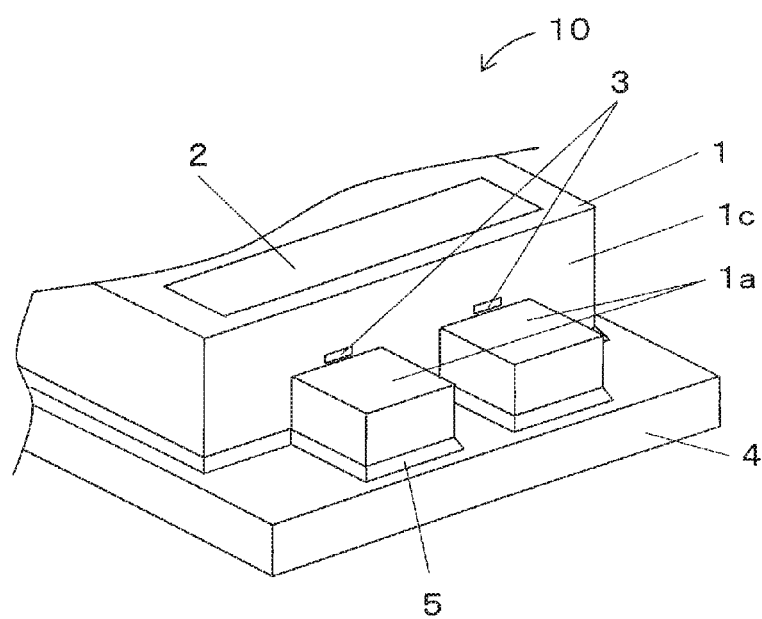

As exemplified in FIG. 6, the wiring conductor 2 may be so designed that an end thereof is led out to a plurality of locations on the top side. Parts of the wiring conductor 2 led out to the plurality of locations on the top side are electrically connected to their respective wirings of the external circuit board.

The wiring conductor 2 has the exposed portion 3 which is a part of an end thereof which is exposed from the side surface 1c of the insulating substrate 1.

Moreover, where a plurality of exposed portions 3 are provided in one and the same side surface 1c of the insulating substrate 1, it is desirable to adjust the spacing between the exposed portions 3 to be greater than or equal to 1.0 mm to suppress ion migration between the exposed portions 3.

Figure 5:
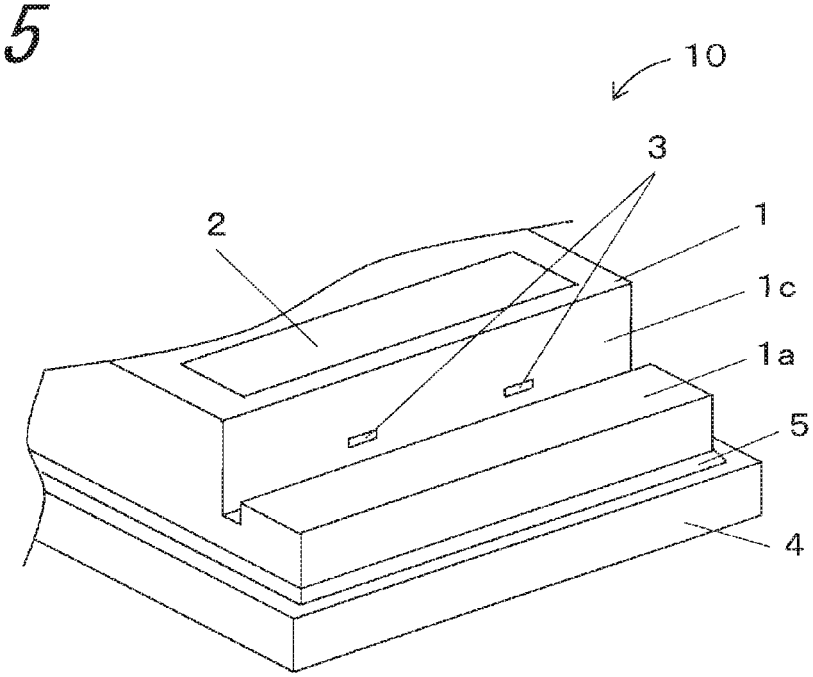
FIG. 5(a) and 5(b) are each an example of a diagrammatic perspective view showing part of the wiring board in accordance with the first embodiment of the invention.
Figure 5:
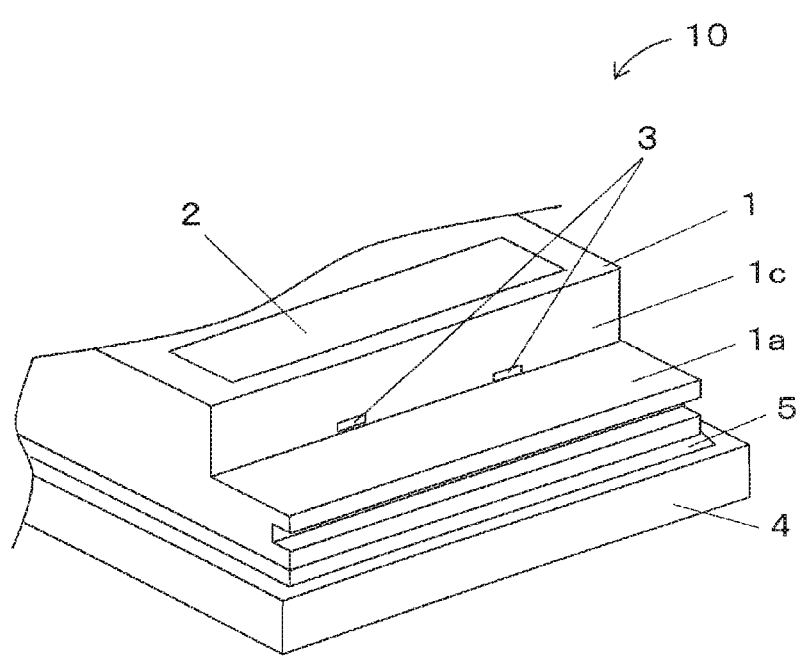

In the case of providing the plurality of exposed portions 3 in one side surface 1c, as exemplified in FIG. 5, by spacing the plurality of exposed portions 3 apart also in a thickness direction of the insulating substrate 1, it is possible to increase the spacing between the exposed portions 3. In order for the exposed portions 3 to be spaced apart in the thickness direction of the insulating substrate 1, for example, when the insulating substrate 1 is composed of a plurality of insulating layers, it is advisable to interpose the wiring conductor 2 between the discrete insulating layers.

For such a wiring conductor 2, a metal material such as tungsten (W), molybdenum (Mo), manganese (Mn), silver (Ag), or copper (Cu) can be used. For example, where the insulating substrate 1 is made of aluminum oxide sintered body, the wiring conductor 2 can be deposited in a predetermined location of the insulating substrate 1 by print-coating a conductor paste, which has been prepared by admixing suitable organic binder and solvent in powder of a high-melting-point metal such as W, Mo, Mn, or the like, in a predetermined pattern on a ceramic green sheet for forming the insulating substrate 1 by means of screen printing, and then co-firing the paste together with the ceramic green sheet for forming the insulating substrate 1. In a case where the wiring conductor 2 is designed as a through conductor, a through hole is created by punching a hole in the green sheet with a die or by subjecting the sheet to lasering prior to the formation of the conductor pattern for forming the wiring conductor 2 formed on the top side, and the conductor paste is charged into the through hole by means of printing, whereby the through conductor can be formed.

The exposed surface of the wiring conductor 2 is plated with a plating layer by the electrolytic plating technique. The plating layer is made of a metal which excels in corrosion resistance and in bondability with a connecting member, such as nickel, copper, gold, or silver. For example, a copper plating layer having a thickness in a range of 0.5 μm to 5 μm approximately, a nickel plating layer having a thickness in a range of 0.5 μm to 5 μm approximately, and a gold plating layer having a thickness in a range of 0.1 μm to 3 μm approximately, or, a nickel plating layer having a thickness in a range of 1 μm to 10 μm approximately, and a silver plating layer having a thickness in a range of 0.1 μm to 1 μm approximately, are deposited one after another on the surface. This makes it possible to protect the wiring conductor 2 from corrosion effectively, as well as to strengthen the adhesion between the device and the wiring conductor 2, the connection between the wiring conductor 2 and the connecting member such as a bonding wire, the connection between an external terminal and a wiring conductor of an external circuit board, and the connection between the metal member 4 and a conductor of the external circuit board.

The metal member 4 is bonded to the lower surface of the insulating substrate 1. The metal member 4 can be prepared with use of a material which is higher in heat conductivity than the insulating substrate 1, for example, a metal material such as copper (Cu), copper-tungsten (Cu—W), or aluminum (Al). For example, where the insulating substrate 1 is made of aluminum oxide sintered body, a material which is higher in heat conductivity than the insulating substrate 1, such as Cu, can be used as the material of formation of the metal member 4. With the provision of the metal member 4 having high heat conductivity, the wiring board 10 is capable of dissipating heat generated by the device mounted thereon in an efficient manner, which leads to improvement in heat dissipation capability.

The metal member 4 is brazed to the lower surface of the insulating substrate 1 with use of a bonding material 5 such for example as a brazing material made of a silver-copper alloy. It is preferable that, in the wiring board 10, a metal is attached to the lower surface of the insulating substrate 1 for the placement of the bonding material 5. In a case where an active brazing metal with added active metal such as Ti, or a resin material in admixture with a metal material having high heat conductivity is used as the bonding material 5, the metal member 4 is bonded to the insulating substrate 1 through the bonding material 5 attached directly to the insulating substrate 1.

In a case where the wiring board 10 includes the insulating substrate 1 whose upper surface bears the cavity 6 for the installation of a light-emitting device for example, as exemplified in FIGS. 5 and 6, it is advisable to provide a reflection layer in the inner wall surface of the cavity 6 for the reflection of light emitted from the light-emitting device.

For example, the reflection layer includes a metal layer 7 attached to the inner wall surface of the cavity 6 and a plating layer deposited on the metal layer 7. Moreover, the metal layer 7 may be electrically connected to the wiring conductor 2.

The metal layer 7 is formed flatly on the inner wall surface of the cavity 6 by the use of the same material and method as those used in the formation of the wiring conductor 2. As the conductor paste for the metal layer 7, the same as the conductor paste for the wiring conductor 2 can be used, or, in the interest of printing capability, it is also possible to use a conductor paste which differs from that conductor paste in respect of the type or amount of the constituent organic binder or solvent.

The plating layer deposited on the surface of the metal layer 7 can be formed of the same material as that constituting the plating layer deposited on the exposed surface of the wiring conductor 2.

For example, in the case of mounting a light-emitting device on the wiring board 10, it is preferable that a silver plating layer is deposited on the surface of the metal layer 7, and a gold plating layer is deposited on the surface of the wiring conductor 2. This is because the gold plating layer is superior to the silver plating layer in point of bondability to the connecting member and the wiring conductor of the external circuit board, while the silver plating layer is higher in light reflectivity than the gold plating layer. Alternatively, the outermost layer of each of the wiring conductor 2 and the metal layer 7 may be provided as a silver-gold alloy plating layer, for example, an alloy plating layer made of a complete solid solution of silver and gold.

In a case where the plating layer deposited on the surface of the metal layer 7 is deposited by the electrolytic plating technique, it is advisable that the wiring conductor 2 connected to the metal layer 7 is provided additionally on the insulating substrate 1. In a case where the plating layer deposited on the surface of the wiring conductor 2 and the plating layer deposited on the surface of the metal layer 7 are made of the same material, it is advisable that the metal layer 7 and the wiring conductor 2 are electrically connected to each other.

The metal layer 7 may disposed on the entire surface of the bottom and inner side of the cavity 6, and also the wiring conductor 2 may be disposed around the cavity 6 on the upper surface of the insulating substrate 1.

Moreover, one of a pair of wiring conductors 2 each having its one end led out to the upper surface of the insulating substrate 1 may be bonded to the metal layer 7 disposed on the bottom surface of the cavity 6 as well as on the inner side surface of the cavity 6. This is effective at rendering the wiring board 10 lower in profile, because there is no need to bury the wiring conductor 2 made for the metal layer 7 in the insulating substrate 1.

In the wiring board 10 for the installation of a light-emitting device for example, where a reflection layer for reflecting light emitted from the light-emitting device is formed on the entire inner surface of the cavity 6, so long as the light-emitting face of the light-emitting device is situated inside the cavity 6, it is possible to increase the luminance of a light-emitting apparatus employing the wiring board.

The electronic apparatus can be constructed by mounting a device on the upper surface of the wiring board 10.

Examples of the device mounted on the wiring board 10 include a semiconductor device such as an IC chip and an LSI chip, a light-emitting device, a piezoelectric element such as a crystal oscillator and a piezoelectric oscillator, and sensors of various types.

For example, where the device is a semiconductor device of flip-chip mounting type, the semiconductor device is mounted on the wiring board 10 by establishing electrical and mechanical connection between the electrode of the semiconductor device and the wiring conductor 2 via a bonding member such as a solder bump, a gold bump, or an electrically conductive resin (such as an anisotropic conductive resin).

On the other hand, for example, where the device is a semiconductor device of wire bonding type, the semiconductor device is, after being secured to a device mounting region by a bonding member, mounted on the wiring board 10 by establishing an electrical connection between the electrode of the semiconductor device and the wiring conductor 2 via a bonding wire.

Figure 7:
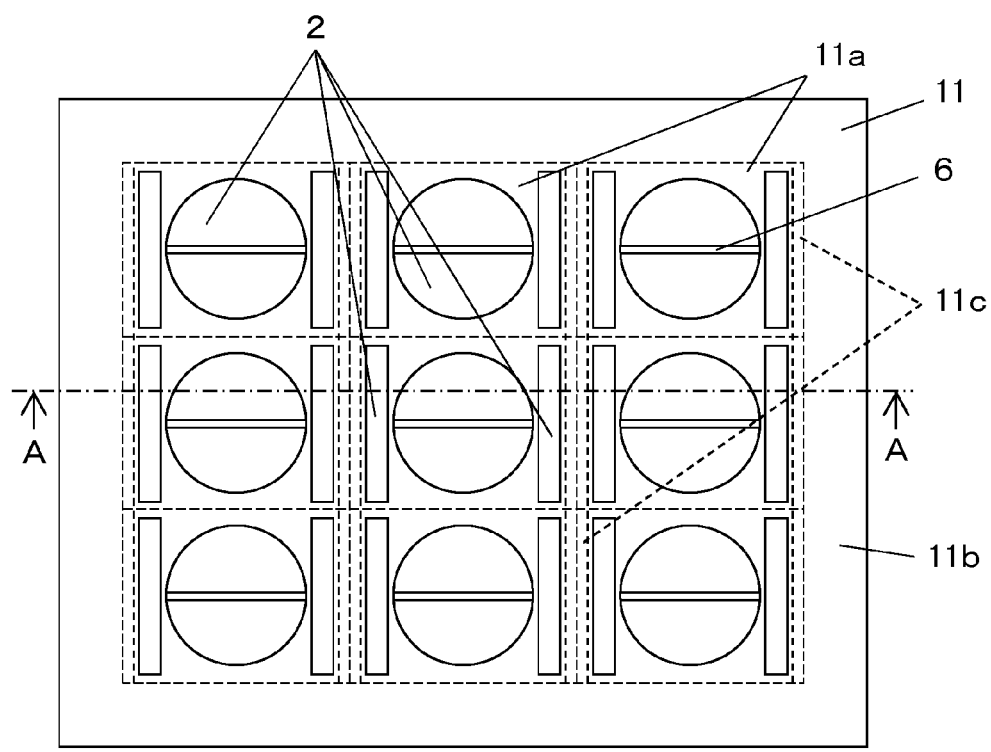
FIG. 7 is a plan view showing a segmentable wiring board in accordance with the first embodiment of the invention.
Figure 8:
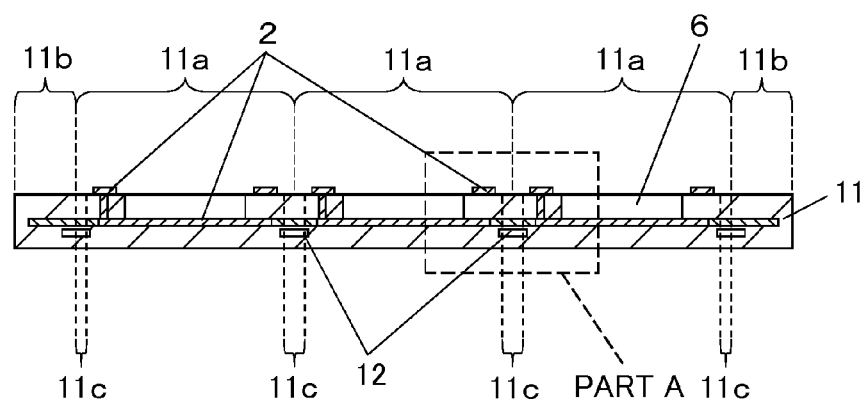
FIG. 8(a) is a sectional view taken along the line A-A shown in FIG. 7(a)
FIG. 8(b) is an enlarged sectional view of a part A shown in FIG. 8(a)
Figure 8:
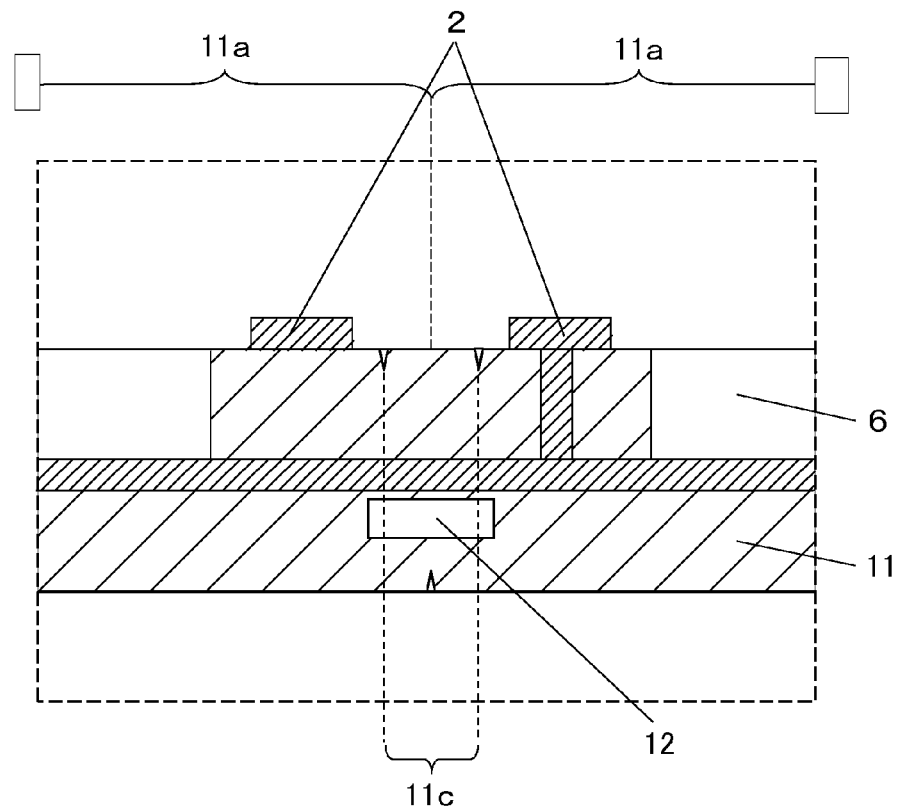

Moreover, the wiring board 10 of the first embodiment can be produced in an efficient manner by splitting a segmentable wiring board 10 as exemplified in FIGS. 7 and 8.

The segmentable wiring board exemplified in FIGS. 7 and 8 includes a 3 by 3 matrix of wiring board regions 11a, or a total of 9 wiring board regions 11a, each of which will constitute the insulating substrate 1 having the protrusion portion 1a-bearing side surface 1c.

It is sufficient that a plurality of wiring board regions 11a are aligned in at least one of the lengthwise direction and the widthwise direction. While the exemplification shown in FIGS. 7 and 8 has the 3 by 3 wiring board region 11a matrix, the number of the wiring board regions 11a to be arranged can be increased. The wiring board region 11a is designed with consideration given to the sizes of a base board 11 and the wiring board region 11a, the placement of the device and the wiring conductor 2 on the wiring board region 11a, and so forth.

The base board 11 has, in the exemplification shown in FIGS. 7 and 8 for example, a dummy region 11b formed around the matrix of the plurality of wiring board regions 11a (the outer periphery of the base board 11). The dummy region 11b is intended to facilitate the production and transportation of the segmentable wiring board, and, by the use of this dummy region 11b, it is possible to effect the positioning, fastening, etc. of a green molded product prepared for the base board 11 or the segmentable wiring board for machining operation and transportation.

The dummy region 11b may be provided with a common conductor which is electrically connected to the wiring conductor 2. It is preferable that the plurality of wiring conductors 2 are electrically connected to each other by the common conductor disposed in the dummy region 11b, because, in this case, an electric current for electrolytic plating can be passed from at least one point of the common conductor.

The provision of the common conductor in frame form in the dummy region 11b affords the advantage to lessen thickness variations among the plating layers deposited on the wiring conductors 2 of the wiring board regions 11a, respectively. By adjusting the cross-sectional area of the common conductor to be greater than the cross-sectional area of the wiring conductor 2, it is possible to suppress resistance increase in the common conductor.

A forming region 11c for forming the protrusion portion 1a is provided in the outer edge of each of the wiring board regions 11a. The forming region 11c is intended to form the protrusion portion 1a in the insulating substrate 1 at the time of dividing the base board 11 into the wiring boards 10. With the provision of a void 12 in the forming region 11c of the base board 11, the base board 11 is divided into board segments along the outer edges of the individual wiring board regions 11a, thereby forming the protrusion portions 1a. For example, such a void 12 is created by causing the insulating layers to separate from each other in the shoulder-forming region 11c under the condition where, at the time of stacking a plurality of ceramic green sheets on top of each other in layers under pressure, no pressure is applied to the shoulder-forming region 11c, or the shoulder-forming region 11c is subjected to a pressure lower than in other regions.

The void 12 can be created also by stacking together a plurality of ceramic green sheets having holes constituting the void 12 formed therethrough by means of lasering, die punching, or otherwise and through hole-free ceramic green sheets, and then firing the resultant laminated body. Moreover, where the base board 11 has a small thickness, it is possible to create through holes constituting the void 12 by means of lasering, die punching, or otherwise after the stacking of a plurality of ceramic green sheets.

In the segmentable wiring board for the production of the wiring board 10 having the side surface 1c bearing the protrusion portion 1a, as exemplified in FIG. 8, it is advisable that the void 12 is made wider than the outer edge of the wiring board region 11a on the top side. This makes it possible to reduce a possibility that a line of demarcation and the void 12 will not overlap each other as seen transparently in a plan view. Moreover, in the process of splitting the board by means of slicing or otherwise, by making a cut to a depth in which the void 12 is formed, it possible to reduce a possibility that the protrusion portion 1a will be cut off.

The void 12 may be opened in the upper surface or lower surface of the base board 11. In the case where the void 12 is opened, in contrast to a case where the void 12 is made as an enclosed space within the base board 11, during the firing of the green molded product of the base board 11, deformation of the protrusion portion 1a resulting from expansion of gas in the void 12 can be suppressed.

In the range of the outer edge of the wiring board region 11a, by forming a division groove, which is so shaped that its cross section becomes wider gradually in the direction toward its opening, in the upper surface or lower surface of the base board 11, it is easy to split the board along the outer edges of the individual wiring board regions 11a successfully.

By splitting the segmentable wiring board along the outer edges of the individual wiring board regions 11a, the insulating substrates 1 as exemplified in FIGS. 1 to 6 can be formed. Then, the metal member 4 is bonded to the lower surface of the insulating substrate 1, thereby producing the wiring board 10. Moreover, the division of the segmentable wiring board allows production of the wiring board 10 having the exposed portion 3 which is a part of the wiring conductor 2 which is exposed from the side surface 1c of the insulating substrate 1.

The division of the board along the outer edges of the wiring board regions 11a may be carried out after the bonding of the metal member 4 to the lower surface of each of the wiring board regions 11a. Note that, as exemplified in FIGS. 1 to 6, in the case of producing the wiring board 10 with the bonded metal member 4 which is larger in width than the insulating substrate 1, it is advisable to form the dummy region 11b around each of the wiring board regions 11a in the segmentable wiring board.

It is also possible to split the segmentable wiring board after the installation of the device on the upper surface of each of the wiring board regions 11a.

The base board 11 can be divided into a plurality of insulating substrates 1 by, for example, a method including forming a division groove in the outer edge of the wiring board region 11a of the base board 11 and bending the base board along the division groove until it is split, or a method including cutting the base board along the outer edge of the wiring board region 11a by means of slicing or otherwise. The division groove can be obtained by making an incision in a green molded product prepared for the base board 11 by sticking a cutter blade into the green molded product or by using slicing equipment in such a manner that the dimension of the incision is smaller than the thickness of the green molded product, or by making an incision after a firing process by slicing equipment in such a manner that its dimension is smaller than the thickness of the base board 11.

In the case of splitting the board through a cutting process by means of slicing or otherwise, so long as two slicing blades of different widths are applied to the upper surface and the lower surface, respectively, of the base board 11, the protrusion portion 1a may be created by effecting cutting operation using slicing equipment without the necessity of forming the void 12 described above.

In the wiring board 10 of this embodiment, the side surface 1c is formed with the protrusion portion 1a located between the wiring conductor 2 exposed from the side surface 1c and the lower surface of the insulating substrate 1, wherefore the distance from the exposed portion 3 on the side surface 1c of the insulating substrate 1 to the lower surface of the insulating substrate 1 can be increased, and correspondingly the distance between the exposed portion 3 of the wiring conductor 2 and the metal member 4 can be increased without causing an increase in the thickness of the wiring board 10. This makes it possible to suppress occurrence of ion migration between the exposed portion 3 of the wiring conductor 2 and the metal member 4, and thereby suppress electrical connection between the exposed portion 3 of the wiring conductor 2 and the metal member 4.

In a case where the protrusion portion 1a has a region which is greater in surface roughness than the side surface 1c, the side surface of the protrusion portion 1a is more susceptible to moisture adhesion than is the upper surface of the protrusion portion 1a, wherefore moisture tends to collect on the side surface of the protrusion portion 1a and is thus less likely to adhere to the entire area ranging from the exposed portion 3 to the metal member 4, which is effective against ion migration.

Moreover, the provision of the protrusion portion 1a in the insulating substrate 1 makes it possible to restrain the bonding material 5 from running up toward the side surface 1c, and thereby suppress that the bonding material 5 will spread over the side surface 1c and eventually reach the exposed portion 3.

The segmentable wiring board of this embodiment includes the base board 11 having a plurality of wiring board regions 11a and the wiring conductor 2 embedded in the base board 11 so as to straddle the plurality of wiring board regions 11a, and the base board 11 has the void 12 provided between the wiring conductor 2 of the base board 11 and the lower surface of the base board 1 so as to straddle the boundary of the plurality of wiring board regions 11a. By splitting such a segmentable wiring board, the insulating substrate 1 of the wiring board 10 of this embodiment can be produced in an efficient manner.

Moreover, where the segmentable wiring board of this embodiment further includes the metal member 4 bonded to the lower surfaces of the wiring board regions 11a of the base board 11, the wiring board 10 of this embodiment can be produced in an efficient manner.

(Second Embodiment)

Next, an electronic apparatus in accordance with the second embodiment of the invention will be described with reference to FIGS. 9 to 11.

Figure 9:
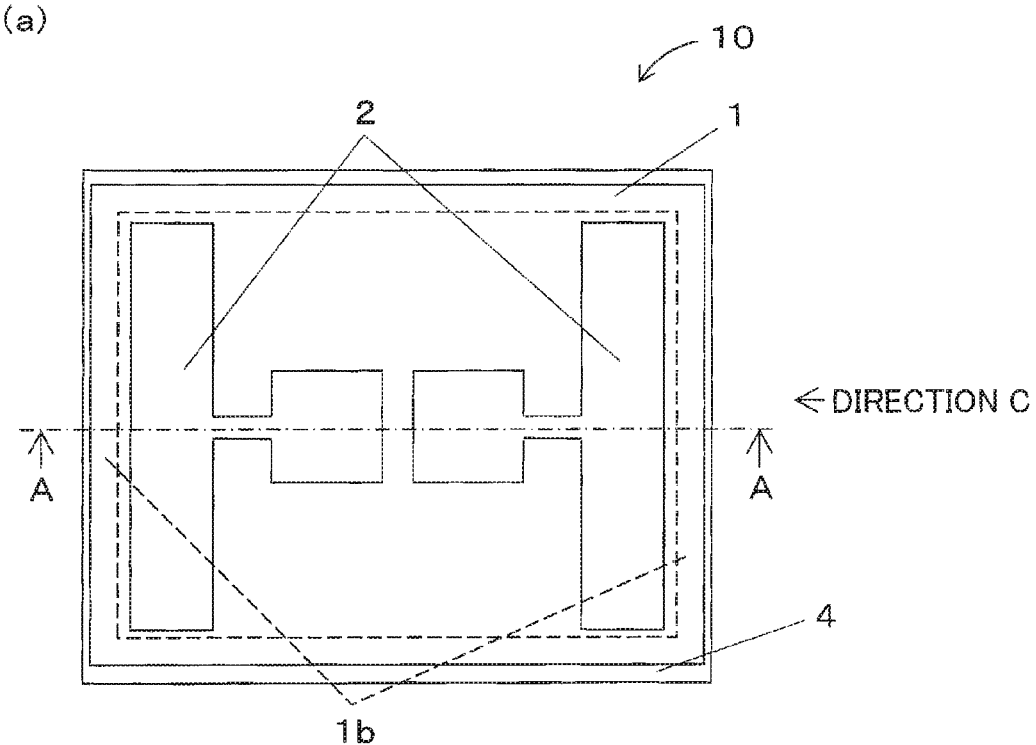
FIG. 9(a) is a plan view showing the wiring board in accordance with the second embodiment of the invention.
FIG. 9(b) is an example of a side view of the wiring board as viewed in a direction C indicated in FIG. 9(a)
Figure 9:
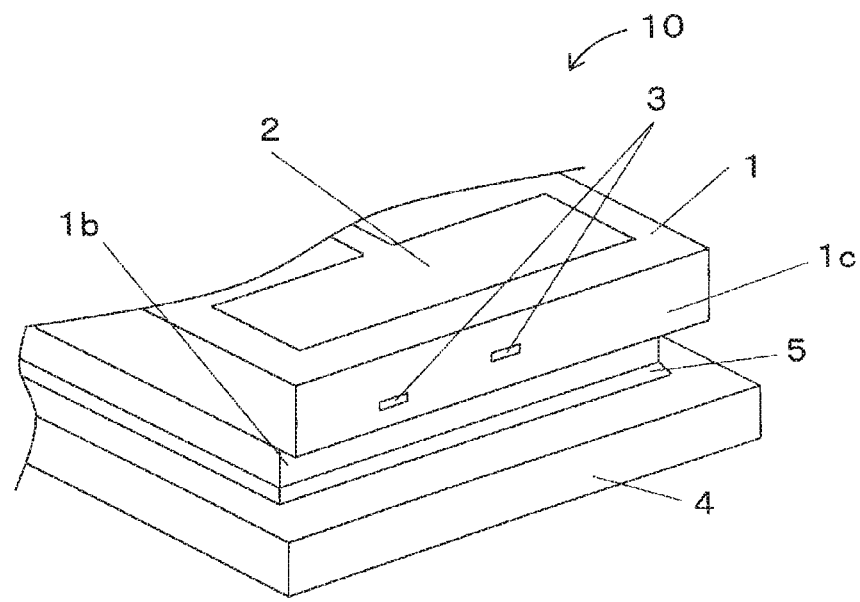
Figure 10:
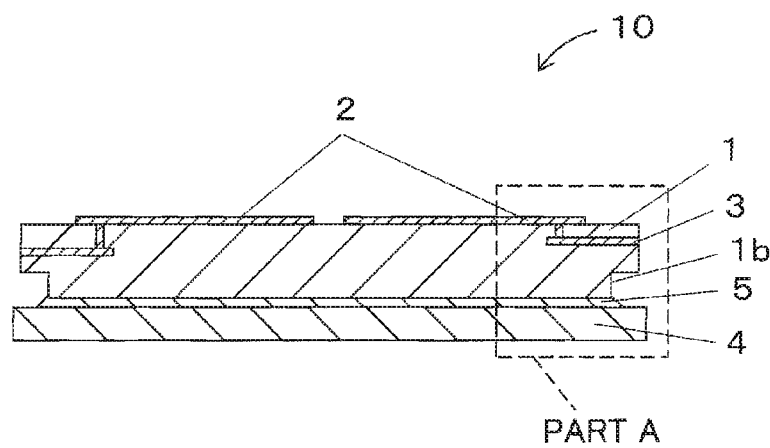
FIG. 10(*a*) is a sectional view taken along the line A-A shown in FIG. 9(*a*), and FIG. 10(*b*) is an enlarged sectional view of a part A shown in FIG. 10(*a*)
Figure 10:
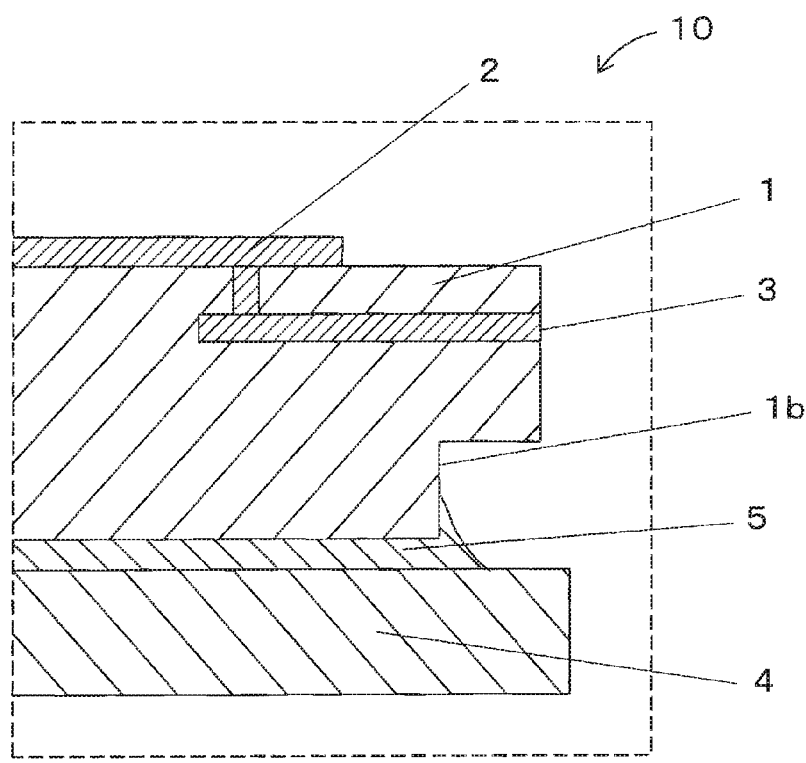
Figure 11:
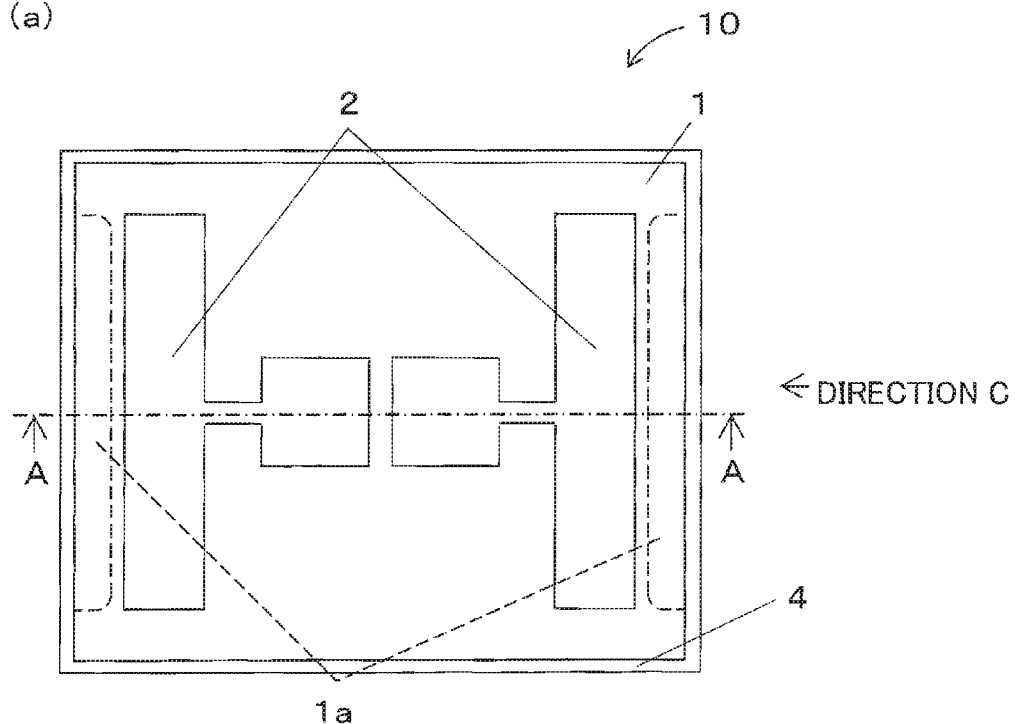
FIG. 11(*a*) is a plan view showing the wiring board in accordance with a second embodiment of the invention, and FIG. 11(*b*) is an example of a diagrammatic perspective view showing part of the wiring board as viewed in a direction C indicated in FIG. 11(*a*)
Figure 11:
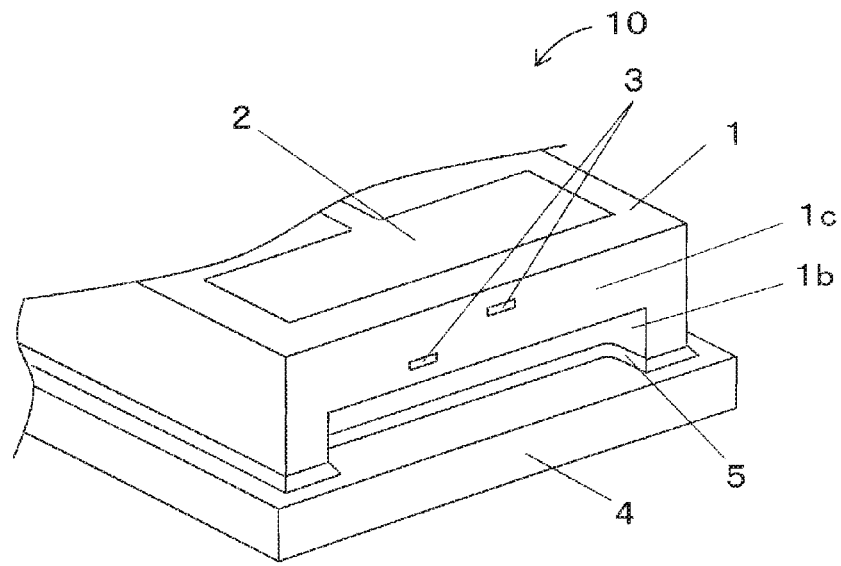

The wiring board 10 of the second embodiment of the invention differs from the wiring board 10 of the preceding first embodiment in that, as exemplified in FIGS. 9 to 11, the insulating substrate 1 has a recess portion 1b provided in its side surface, and the wiring conductor 2 is partly exposed above the recess portion 1b from the side surface 1c of the insulating substrate 1 to provide an exposed portion 3.

The wiring board 10 of this embodiment includes the wiring conductor 2 having the exposed portion 3 which is a part of the wiring conductor 2 which is exposed above the recess portion 1b from the side surface 1c of the insulating substrate 1, wherefore the distance from the exposed portion 3 on the side surface 1c of the insulating substrate 1 to the lower surface of the insulating substrate 1 can be increased, and correspondingly the distance between the exposed portion 3 of the wiring conductor 2 and the metal member 4 can be increased without causing an increase in the thickness of the wiring board 10. This makes it possible to suppress occurrence of ion migration between the exposed portion 3 of the wiring conductor 2 and the metal member 4, and thereby suppress electrical connection between the exposed portion 3 of the wiring conductor 2 and the metal member 4.

In this way, where the insulating substrate 1 has the recess portion 1b situated toward its lower surface beyond the exposed portion 3, in contrast to the case of providing the protrusion portion 1a, the wiring board 10 can be made smaller in size when seen in a plan view.

It is preferable that the concave length of the recess portion 1b is greater than or equal to 1.0 mm for the sake of suppressing occurrence of short-circuiting between the exposed portion 3 and the metal member 4 due to ion migration which arises between the exposed portion 3 and the metal member 4.

As exemplified in FIG. 9, by providing the recess portion 1b so as to extend entirely longitudinally of the side surface 1c provided with the exposed portion 3 in a plan view seen from the direction C, it is possible to suppress ion migration over the entire side surface 1c provided with the exposed portion 3.

As exemplified in FIG. 9, by providing the recess portion 1b in each and every side surface 1c of the rectangular insulating substrate 1, the bonding material 5 is restrained from running up to the entire outer periphery of the insulating substrate 1, which is effective against the spread of the bonding material 5.

As exemplified in FIG. 10, by providing the recess portion 1b in part of the side surface 1c of the insulating substrate 1, it is possible to suppress a decrease in the area of adhesion between the insulating substrate 1 and the metal member 4, and thereby suppress deterioration in the capability of heat dissipation in the insulating substrate 1 and the metal member 4.

Figure 12:
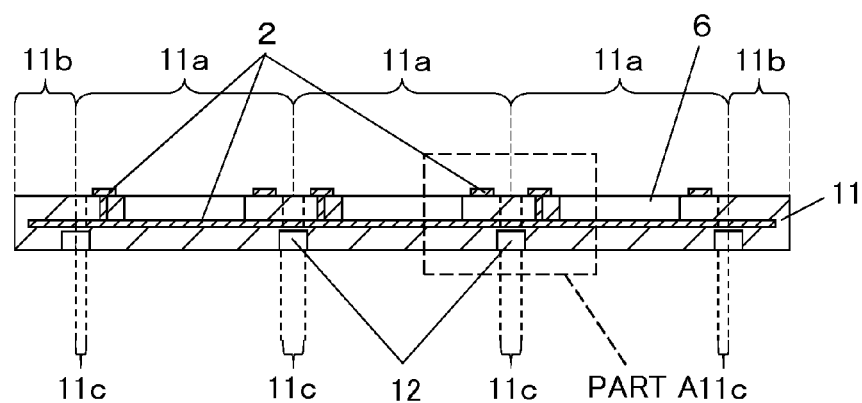
FIG. 12(*a*) is a sectional view showing the segmentable wiring board in accordance with the second embodiment of the invention, and FIG. 12(*b*) is an enlarged sectional view of a part A shown in FIG. 12(*a*)
Figure 12:
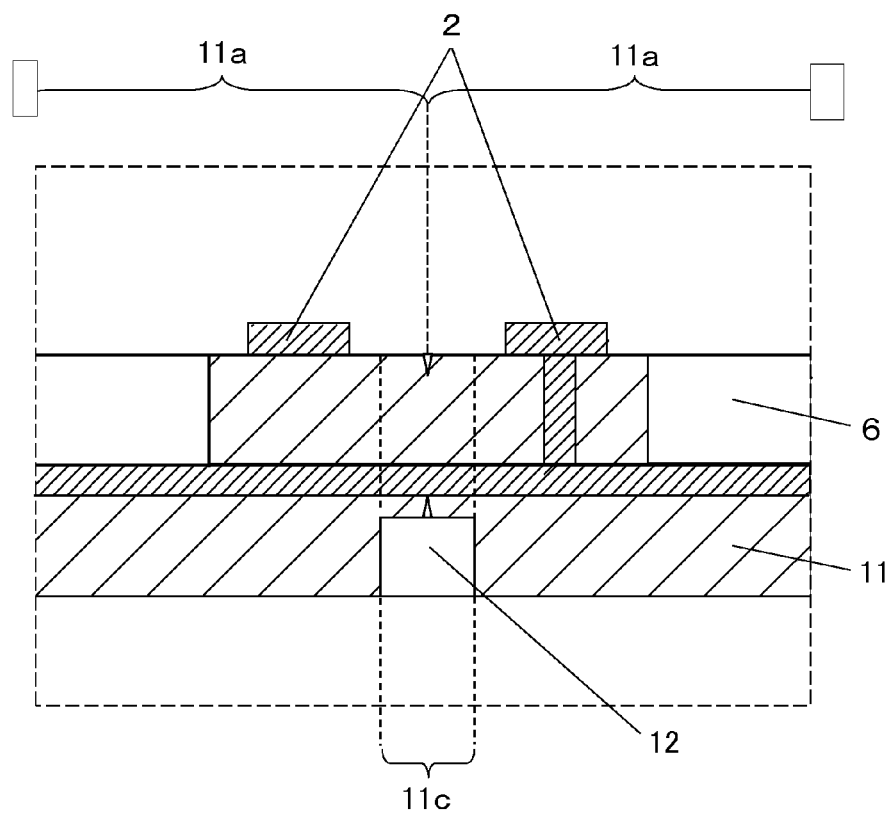

The segmentable wiring board exemplified in FIG. 12 includes a 3 by 3 matrix of wiring board regions 11a, or a total of 9 wiring board regions 11a, each of which will constitute the insulating substrate 1 having the recess portion 1b-bearing side surface 1c.

A forming region 11c for forming the recess portion 1b is provided in the outer edge of each of the wiring board regions 11a. The forming region 11c is intended to form the recess portion 1b in the insulating substrate 1 at the time of dividing the base board 11 into the wiring boards 10. With the provision of a void 12 in the forming region 11c of the base board 11, the base board 11 is divided into board segments along the outer edges of the individual wiring board regions 11a, thereby forming the recess portion 1b.

As exemplified in FIG. 12, the void 12 may be opened in the lower surface of the base board 11. In the case where the void 12 is opened, in contrast to a case where the void 12 is made as an enclosed space within the base board 11, during the firing of the green molded product of the base board 11, deformation of the recess portion 1b resulting from expansion of gas in the void 12 can be suppressed.

It should be noted that the invention is not limited to the exemplificative embodiments as described heretofore, and therefore various changes and modifications are possible. For example, the wiring board 10 may be constructed by bonding a plurality of insulating substrates 1 to a single metal member 4.

Figure 13:
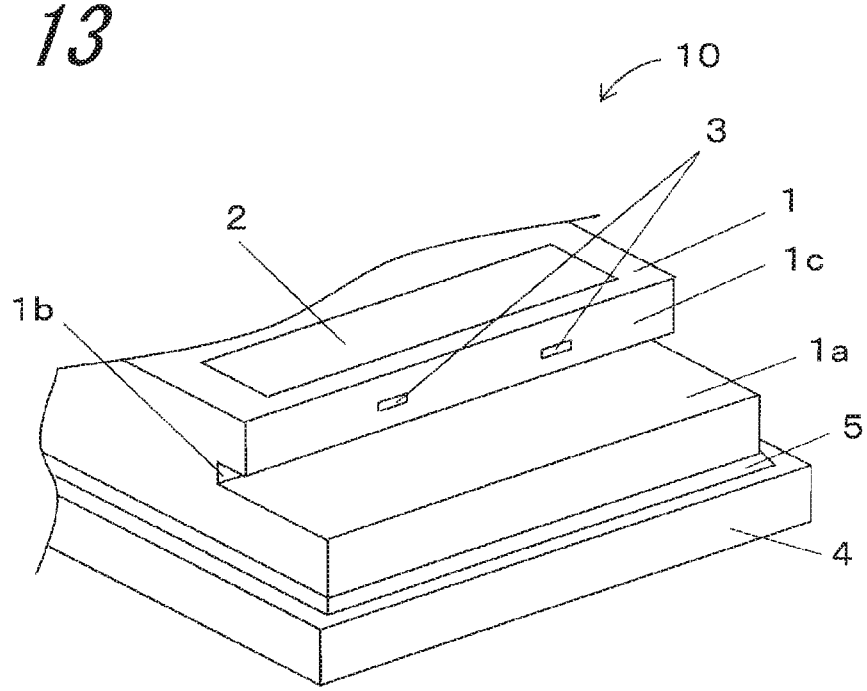
FIGS. 13(*a*) and 13(*b*) are each an example of a perspective view showing the wiring board in accordance with an embodiment of the invention.
Figure 13:
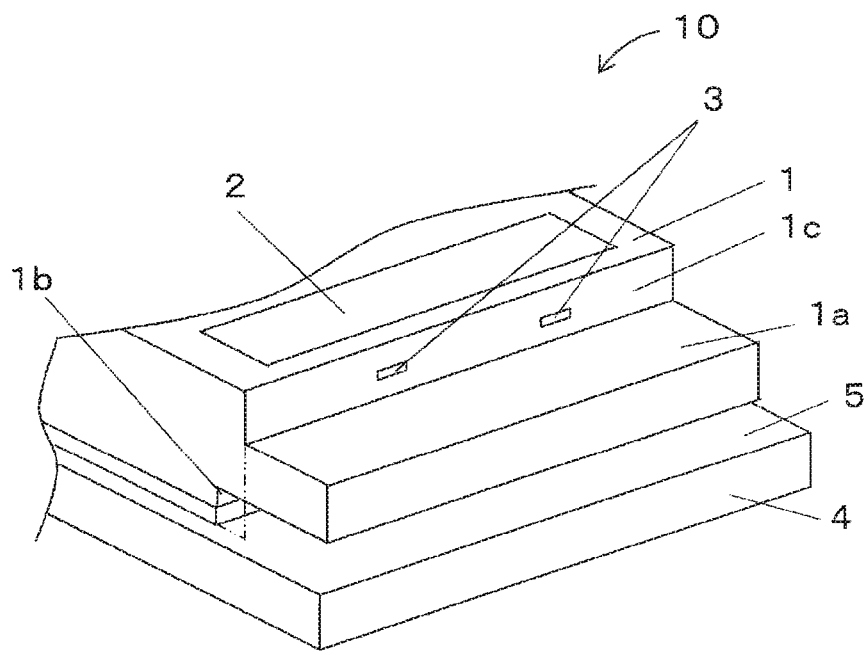

As exemplified in FIGS. 13(a) and 13(b), both of the protrusion portion 1a and the recess portion 1b may be provided.

Moreover, as exemplified in FIG. 13(a), where the recess portion is provided above the protrusion portion 1a in the side surface 1c, in contrast to the case of providing the recess portion in the upper surface of the protrusion portion 1a, the protrusion portion 1a will not be made thinner in part, wherefore the protrusion portion 1a can be protected from breakage during the manufacturing process.

Further, the exposed portion 3 may also be situated on the adjacent side surfaces 1c of the insulating substrate 1.

In the base board 11, where the dummy region 11b is formed around each of the wiring board regions 11a, the common conductors may be arranged in a grid pattern in the dummy regions 11b among the wiring board regions 11a.

By varying the thickness of the bonding material 5 from part to part so that the part corresponding to the midportion of the insulating substrate 1 is smaller in thickness than the part corresponding to the outer periphery of the insulating substrate 1, it is possible to afford the advantage to enhance the capability of heat dissipation from the insulating substrate 1 toward the metal member 4 in the middle of the insulating substrate 1 where the device is mounted.

REFERENCE SIGNS LIST

1: Insulating substrate
1a: Protrusion portion
1b: Concavity portion
1c: Side surface
2: Wiring conductor
3: Exposed portion
4: Metal member
5: Bonding material
6: Cavity
7: Metal layer
10: Wiring board
11: Base board
11a: Wiring board region
11b: Dummy region
11c: Forming region
12: Void

The invention claimed is:

1. A wiring board, comprising:
   an insulating board formed of ceramics, the insulating board having an upper surface, a lower surface opposite to the upper surface, and a side surface connected to the upper surface and the lower surface, the side surface including a first side surface part connected to the upper surface and a second side surface part connected to the lower surface; and
   a wiring conductor embedded in the insulating board and partly exposed from the first side surface part of the side surface of the insulating board,
   the side surface of the insulating board having a recess portion located between the wiring conductor exposed from the side surface of the insulating board and the lower surface of the insulating board, and the second side surface part located closer to a center in a lengthwise direction of the insulating board than the first side surface part to form the recess portion.

2. The wiring board according to claim 1, further comprising:
   a metal member bonded to the lower surface of the insulating board.

3. The wiring board according to claim 1,
   wherein the recess portion has a region which is greater in surface roughness than the side surface of the insulating board.

4. An electronic apparatus, comprising:
   the wiring board according to claim 2; and
   an electronic device mounted on the wiring board.

5. A segmentable substrate, comprising:
   a base substrate formed of ceramics and having a plurality of wiring board regions;
   a wiring conductor embedded in the base substrate so as to straddle the plurality of wiring board regions,
   the base substrate having a void provided between the wiring conductor of the base substrate and a lower surface of the base substrate so as to straddle a boundary of the plurality of wiring board regions; and a dividing groove being formed in a part of the base substrate which part faces the void and is located between the wiring conductor and the lower surface of the base substrate, the dividing groove being provided at the boundary of plurality of wiring board regions.

6. The segmentable substrate according to claim 5, further comprising:

a metal member bonded to lower surfaces of the wiring board regions of the base substrate.

* * * * *